(12) United States Patent
Nichols

(10) Patent No.: US 7,881,413 B2
(45) Date of Patent: Feb. 1, 2011

(54) DIGITAL PLL WITH CONDITIONAL HOLDOVER

(75) Inventor: Richard A. Nichols, Richardson, TX (US)

(73) Assignee: ADC Telecommunications, Inc., Eden Prairie, MN (US)

(*) Notice: Subject to any disclaimer, the term of this patent is extended or adjusted under 35 U.S.C. 154(b) by 2127 days.

(21) Appl. No.: 10/087,610

(22) Filed: Mar. 1, 2002

(65) Prior Publication Data

US 2002/0190764 A1 Dec. 19, 2002

Related U.S. Application Data

(60) Provisional application No. 60/272,933, filed on Mar. 2, 2001.

(51) Int. Cl.
*H03D 3/24* (2006.01)
(52) U.S. Cl. .................... 375/354; 375/373; 375/376
(58) Field of Classification Search ............... 331/11, 331/10; 714/703; 370/105.1, 503, 520, 516; 375/354–376, 108; 455/115
See application file for complete search history.

(56) References Cited

U.S. PATENT DOCUMENTS

| | | | | |
|---|---|---|---|---|
| 4,849,993 | A * | 7/1989 | Johnson et al. | ............... 375/357 |
| 5,317,601 | A | 5/1994 | Riordan et al. | |
| 5,555,247 | A * | 9/1996 | Matsuoka et al. | ........... 370/350 |
| 5,581,555 | A * | 12/1996 | Dubberly et al. | ............ 370/487 |
| 5,726,607 | A | 3/1998 | Brede et al. | |
| 5,990,715 | A | 11/1999 | Nishimura | |
| 5,994,934 | A | 11/1999 | Yoshimura et al. | |
| 6,014,414 | A * | 1/2000 | Yamamoto et al. | .......... 375/356 |
| 6,049,239 | A | 4/2000 | Eto et al. | |
| 6,065,140 | A * | 5/2000 | Irwin | ........................ 714/703 |
| 6,104,915 | A | 8/2000 | Zhang et al. | |
| 6,242,954 | B1 | 6/2001 | Taniguchi et al. | |
| 6,304,582 | B1 * | 10/2001 | Zhang et al. | ................ 370/503 |
| 6,313,676 | B1 | 11/2001 | Abe et al. | |
| 6,323,705 | B1 | 11/2001 | Shieh et al. | |
| 6,356,156 | B2 * | 3/2002 | Wesolowski | ................. 331/10 |

(Continued)

OTHER PUBLICATIONS

"Timing Characteristics of Primary Reference Clocks", International Telecommunication Union, ITU-T G.811, Series G: Transmission Systems and Media, Digital Systems and Networks, Digital Transmission Systems—Digital Networks—Design Objectives for Digital Networks, Sep. 1997, pp. 1-4.

(Continued)

*Primary Examiner*—David C Payne
*Assistant Examiner*—Linda Wong
(74) *Attorney, Agent, or Firm*—Fogg & Powers LLC

(57) ABSTRACT

Phase locked loops (PLL) providing for conditional holdover are especially suited for use in communications networks. During a holdover condition, the timing signal is generated without use of an input reference clock signal. The PLLs may either enter or remain in a holdover condition if the demonstrated or expected quality level of the output of the PLL equals or exceeds the indicated quality level of the input reference clock signal. In this manner, the timing signal has an expected quality level equal to or greater than the quality level of the reference clock signal. Accordingly, network timing errors may be reduced to levels below those associated with using the reference clock signal.

25 Claims, 7 Drawing Sheets

U.S. PATENT DOCUMENTS

| | | | |
|---|---|---|---|
| 6,384,649 | B1 | 5/2002 | Boerstler et al. |
| 6,424,185 | B1 | 7/2002 | Wolf |
| 6,441,692 | B1 | 8/2002 | Nakatani et al. |
| 6,462,623 | B1 | 10/2002 | Horan et al. |
| 6,542,039 | B1* | 4/2003 | Ogura .................. 331/11 |
| 6,943,609 | B2* | 9/2005 | Zampetti et al. ......... 327/292 |
| 2002/0022465 | A1* | 2/2002 | McCullagh et al. ...... 455/260 |
| 2002/0080901 | A1* | 6/2002 | Ham, III ............... 375/376 |
| 2002/0097743 | A1* | 7/2002 | Baydar et al. .......... 370/463 |

OTHER PUBLICATIONS

"Timing Requirements of Slave Clocks Suitable for use as Node Clocks in Synchronization Networks", International Telecommunication Union, ITU-T G.812, Series G: Transmission Systems and Media, Digital Systems and Networks, Digital Transmission Systems—Digital Networks—Design Objectives for Digital Networks, Jun. 1998, pp. 1-36.

"Symmetricom's DCD-500 Series Version 5 with SSM", Symmetricom, Apr. 1999, pp. 1-15.

"Synchronizing Telecommunication Networks, Basic Concepts", Symmetricom, pp. 1-23, 2001.

"Synchronizing Telecommunications Networks, Fundamentals of Synchronization Planning", Symmetricom, 2000, pp. 1-23.

"SDH Telecommunications Standard Primer", Tektronix, Inc., 2000, pp. 1-40.

Green, et al., "Keeping in synch with Sonet: How to manage Sonet networks using Synchronization Status Messages", America's Network, www.americaasnetwork.com, Sep. 15, 1997, pp. 1-10.

Lesea, "Stratum Levels Defined", Larus, Timing Booklet, Chapter 4, www.laruscorp.com, 1998, pp. 1-3.

* cited by examiner

DIGITAL PLL WITH CONDITIONAL HOLDOVER

RELATED APPLICATION

This application claims priority to U.S. Provisional Patent Application Ser. No. 60/272,933 filed Mar. 2, 2001 and titled "Digital PLL with Conditional Holdover," which is commonly assigned and incorporated by reference herein.

TECHNICAL FIELD

The present invention relates generally to the field of communication systems and, in particular, to systems for establishing and maintaining a timing signal for synchronization of communications.

BACKGROUND

Communications systems generally require that the operation of synchronous transmission elements within the system be coordinated to some timing signal derived from a reference clock signal. The derived timing signal is synchronized, or locked, to the reference clock signal. One well-known clock synchronization technique is the use of a phase locked loop (PLL).

A PLL is a frequency-selective circuit generally containing a phase comparator, a low-pass filter, and an oscillator coupled in a feedback arrangement. When an input or reference clock signal is applied to the PLL, the phase comparator compares the phase of the reference clock signal with the phase of the oscillator output signal and generates an error signal that is related to the phase relationship between the two signals. This error signal is filtered, amplified, and applied to the oscillator, thus driving the frequency of the oscillator output signal in a direction to more closely align its phase to that of the reference clock signal. When the oscillator output frequency is sufficiently close to the reference frequency, the feedback nature of the PLL causes the oscillator output to lock to the reference clock signal frequency, with the exception of some finite phase difference. The point is called the "zero phase error." While the phases may not be aligned, their frequencies are matched such that the amount of phase difference remains substantially constant. The self-correcting nature of the PLL thus allows the system to track the frequency changes of the reference clock signal once it is locked. A frequency divider is often inserted in the feedback loop when the desired output frequency of the oscillator is some multiple of the reference clock signal frequency.

FIG. 1 is a block diagram of a typical PLL 100. The PLL 100 includes a phase comparator 110 having a first input for the reference clock signal and a second input for the feedback signal. The output of the phase comparator 110 is coupled to the input of a loop filter 120. The output of the loop filter 120 is coupled to the input of an oscillator 130 for providing the control signal to the oscillator 130. The oscillator 130 is often a voltage-controlled oscillator (VCO) or a digitally-controlled or numerically-controlled oscillator (NCO). An NCO generally includes a fixed-frequency oscillator and a synthesizer for providing a scaled output signal derived from a reference frequency of the fixed-frequency oscillator. The output of the oscillator 130 is fed back to the second input of the phase comparator 110 through a frequency divider 140.

Crystal oscillators are generally used in precision PLLs. These oscillators are preferred due to their high accuracy. Such oscillators are capable of maintaining a frequency within 1 ppm of the desired frequency. However, crystal oscillators may be prone to long-term drift.

In communications systems, the timing signal must be maintained, even if the reference clock signal is lost or degraded, in order to avoid loss of transmission data. A holdover signal may be applied to the oscillator as a control signal in the event the PLL goes open-loop, i.e., the PLL loses its reference clock signal, or otherwise enters an impaired operating condition due to degradation of the reference clock signal. The holdover signal is the expected control signal necessary to produce the desired frequency of the timing signal.

Communication systems generally make use of a hierarchy of timing sources. These timing sources have quality levels that are often defined in terms of strata. Each stratum level has, among other requirements, a defined maximum drift as a fractional frequency offset. For example, a Stratum 1 clock is a primary reference source. Such primary reference sources may be autonomous timing sources or they may generate their timing signal from an external reference clock signal. Stratum 1 clocks have a drift of $10^{-11}$ or less. A Stratum 2 clock tracks a reference clock signal (such as a Stratum 1 signal) under normal operations and maintains its frequency in holdover conditions. Stratum 2 clocks have a maximum drift of $10^{-10}$ per day in the absence of the reference clock signal. A Stratum 3E (Stratum 3 Enhanced) clock tracks a reference clock signal (such as a Stratum 1 or Stratum 2 signal) under normal operations and maintains its frequency in holdover. Stratum 3E clocks have a maximum drift of $10^{-8}$ per day in the absence of the reference clock signal. Additional requirements and strata are known, as well as other industry-recognized quality levels.

Timing sources of the type described above generally provide information regarding their stratum level or other quality characteristics. As an example, the Synchronization Status Message (SSM) of Synchronous Optical Network (SONET)/Synchronous Digital Hierarchy (SDH) formats uses a portion of each carrier signal to indicate the acceptability status and quality level of the signal. SSMs relay information regarding the quality level of the timing signal provided by a network element. Downstream elements pass this upstream timing information to subsequent nodes. While SSMs were originally used to pass information between network elements within the frame overhead, it is not uncommon to have this information passed through to a Building Integrated Timing Supply (BITS)/Synchronization Supply Unit (SSU) clock via its DS1/E1 interface.

A network element may have multiple timing reference sources available for generation of a timing signal. Timing circuits often include capabilities to switch to an alternate reference source should the primary reference source fail or degrade to an unacceptable level. It is generally preferable to synchronize a communications system using a timing signal having the highest quality level.

For the reasons stated above, and for other reasons stated below which will become apparent to those skilled in the art upon reading and understanding the present specification, there is a need in the art for alternative systems capable of establishing and maintaining a communications timing signal.

SUMMARY

The above-mentioned problems with communications systems and other problems are addressed by the present invention and will be understood by reading and studying the following specification.

The various embodiments of the invention provide for a conditional holdover of the phase locked loop (PLL). Such embodiments may either enter or remain in a holdover condition if the demonstrated or expected quality level of the timing signal of the PLL equals or exceeds the indicated quality level of the reference clock signal. In this manner, the timing signal has an expected quality level equal to or greater than the quality level of the reference clock signal. Accordingly, network timing errors may be reduced to levels below those associated with using the reference clock signal.

For one embodiment, the invention provides a phase locked loop. The phase locked loop includes a phase comparator having a first input for receiving a reference clock signal, a second input for receiving a feedback signal, and an output for providing an error signal. The phase locked loop further includes a loop filter having an input for receiving the error signal and an output for providing a control signal, and an oscillator having an input for receiving the control signal and an output for providing a timing signal. The feedback signal is derived from the timing signal. The phase locked loop still further includes a processor coupled to the oscillator, wherein the processor is further coupled to receive a status message indicative of a quality level of the reference clock signal, and a machine-readable medium coupled to the processor. The machine-readable medium has instructions stored thereon capable of causing the processor to monitor the status message and to selectively place the phase locked loop in a holdover condition in response to the status message.

For another embodiment, the invention provides a phase locked loop. The phase locked loop includes a phase comparator having a first input for receiving a reference clock signal, a second input for receiving a feedback signal, and an output for providing an error signal. The phase locked loop further includes a loop filter having an input for receiving the error signal and an output for providing a control signal, and an oscillator having an input for receiving the control signal and an output for providing a timing signal. The feedback signal is derived from the timing signal. The phase locked loop still further includes a processor coupled to the oscillator, wherein the processor is further coupled to receive a status message indicative of a quality level of the reference clock signal, and a machine-readable medium coupled to the processor. The machine-readable medium has instructions stored thereon capable of causing the processor to monitor the status message and to place the phase locked loop in a holdover condition if the quality level indicated by the status message is below a target quality level.

For yet another embodiment, the invention provides a method of generating a timing signal. The method includes generating the timing signal from a reference clock signal in a phase locked loop, monitoring a status message indicative of a quality level of the reference clock signal, and placing the phase locked loop in a holdover condition if the quality level indicated by the status message is below a target level.

For a further embodiment, the invention provides a method of generating a timing signal. The method includes generating the timing signal from a reference clock signal in a phase locked loop, wherein the reference clock signal is selected from the group consisting of a primary reference clock signal and at least one secondary reference clock signal. The method further includes monitoring status messages indicative of a quality level of the primary reference clock signal and the at least one secondary reference clock signal. The method still further includes placing the phase locked loop in a holdover condition if the quality level indicated by each status message is below a target level regardless of a validity of any reference clock signal.

For a still further embodiment, the invention provides a method of generating a timing signal. During a time when a primary reference clock signal is valid and has an indicated quality level at or above a target level, the method includes generating a first error signal indicative of a phase relationship between the primary reference clock signal and a first feedback signal, filtering the first error signal to produce a first control signal, generating the timing signal in response to the first control signal, and deriving the first feedback signal from the timing signal. During a time when the primary reference clock signal is failed or has an indicated quality level below the target level, and when a secondary reference clock signal is valid and has an indicated quality level at or above the target level, the method includes generating a second error signal indicative of a phase relationship between the secondary reference clock signal and a second feedback signal, filtering the second error signal to produce a second control signal, generating the timing signal in response to the second control signal, and deriving the second feedback signal from the timing signal. During a time when each reference clock signal is failed or has an indicated quality level below the target level, regardless of signal validity, the method includes generating a holdover control signal and generating a timing signal in response to the holdover control signal.

The invention further includes apparatus and methods of varying scope.

DETAILED DESCRIPTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical, or mechanical changes may be made without departing from the scope of the present invention. The following detailed description is, therefore, not to be taken in a limiting sense, and the scope of the present invention is defined only by the appended claims and equivalents thereof.

As a practical matter, the various embodiments make use of a phase locked loop (PLL) capable of supplying a timing signal with extremely low drift in the absence of a reference clock signal. An example of one such PLL will be described with reference to FIG. 2. However, other PLL arrangements may be used with the invention.

Figure 1:
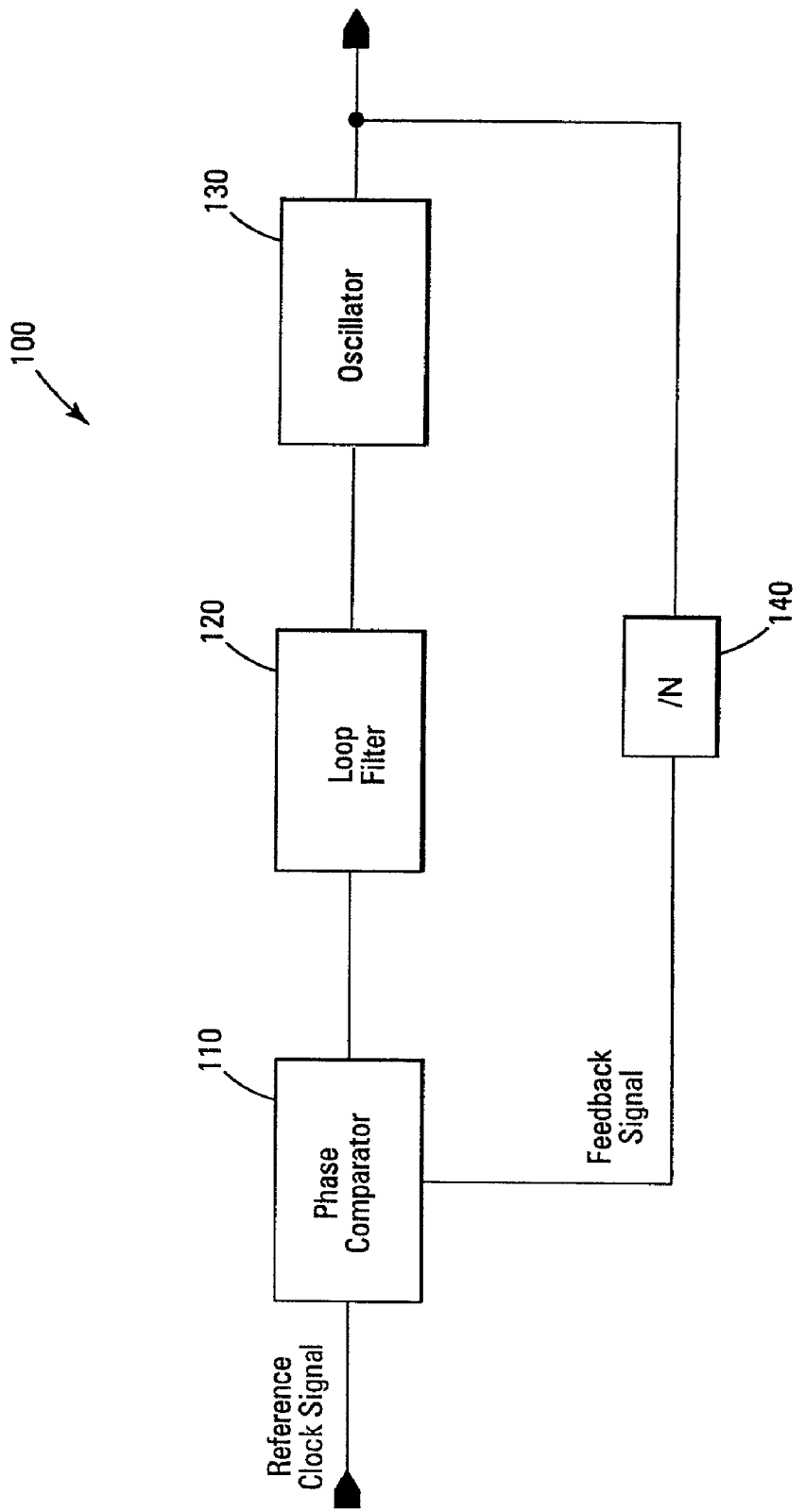
FIG. 1 is a block diagram of a typical phase locked loop.
Figure 2:
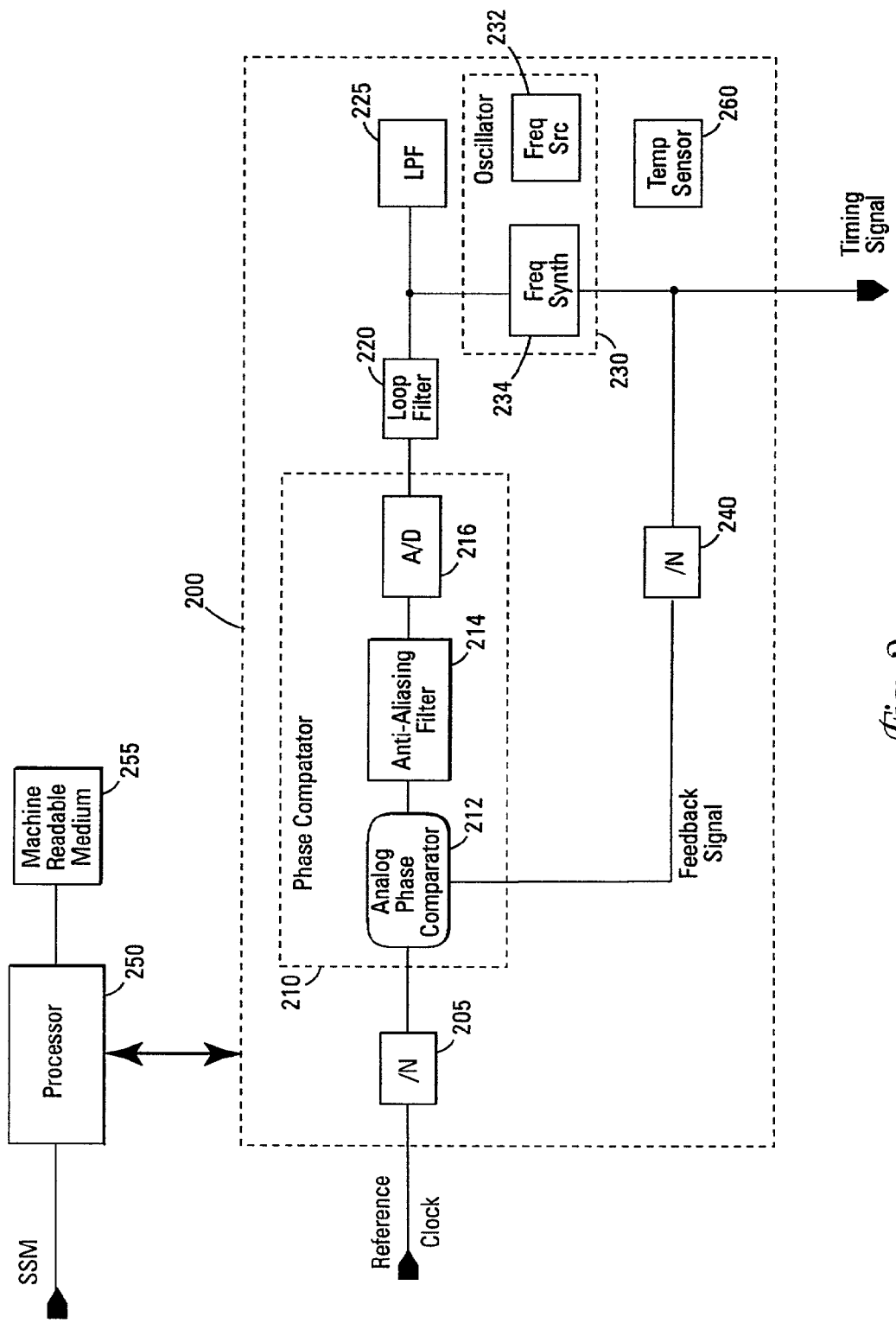
FIG. 2 is a block diagram of a direct digital synthesizer phase locked loop in accordance with an embodiment of the invention.

FIG. 2 is a block diagram of a PLL 200. The PLL 200 includes a phase comparator 210, a loop filter 220 and an oscillator 230 in a feedback loop arrangement having a closed-loop bandwidth of K. A reference clock signal is provided to a first input of the phase comparator 210. The reference clock signal may be frequency divided by a selected factor using a frequency divider 205 prior to input to the phase comparator. Frequency divider 205 is shown as a divide-by-N counter. Such frequency division may be useful to extend the phase range of the phase comparator 210, allowing the phase comparator 210 to remain linear while the input phase changes with respect to the phase of the feedback signal. To maintain the frequency of the timing signal equal to the frequency of the reference clock signal prior to frequency division, the feedback signal must be frequency divided by the same factor, N, such as by the frequency divider 240.

For one embodiment, the oscillator 230 is a numerically-controlled oscillator (NCO) including a fixed frequency source 232 and a frequency synthesizer 234. The fixed frequency source 232 may be a crystal oscillator and, in particular, an oven-controlled crystal oscillator (OCXO). As recognized in the art, crystal oscillators are capable of providing highly-accurate output frequencies. Oven-controlled crystal oscillators are crystal oscillators utilizing temperature-controlled environments for the oscillating crystal, thus further improving their accuracy. While the OCXO is utilized for one embodiment, other fixed frequency sources may also be used.

For one embodiment, the frequency synthesizer 234 is a direct digital synthesizer (DDS). The frequency synthesizer 234 scales the frequency of the output signal of the fixed frequency source 232 in response to a control signal. A DDS scales the frequency of the output signal of the fixed frequency source 232 in response to a digital control signal. Thus, the frequency synthesizer 234 derives the timing signal from a reference frequency in response to the control signal. As an example, using a 32-bit DDS as the frequency synthesizer having an input frequency of 10.000 MHz from the fixed frequency source 232 and a desired output frequency of 3.24 MHz, the desired control word or control signal to the DDS would be $(3.24/10.000) \times 2^{32}$ or approximately 1,391,569,404. Stated alternatively, the desired control signal is the desired output frequency divided by the gain ($K_o$) of the frequency synthesizer, where the gain of the frequency synthesizer equals the input frequency times the granularity of the frequency synthesizer, the granularity being the inverse of the maximum control signal or range of control signals.

The phase comparator 210 for one embodiment is a digital phase comparator. The phase comparator 210 generates an error signal indicative of a phase relationship between the reference clock signal and the feedback signal. Where the control signal for the oscillator 230 is digital, it is preferred that the error signal also be digital. While a purely digital phase comparator could be used, such as an XOR logic block, FIG. 2 shows that a digital phase comparator can include analog components. As shown, the phase comparator 210 includes an analog phase comparator 212 for receiving the reference clock signal on a first input and the feedback signal on a second input. The analog phase comparator 212 may be, for example, an edge detector phase comparator. The analog phase comparator 212 provides an analog error signal, such as a voltage signal, on its output. The phase comparator 210 further includes an anti-aliasing filter 214 for receiving the output of the analog phase comparator 212 and providing a filtered analog error signal. The anti-aliasing filter 214 is used to prevent higher frequencies, in either the signal or noise, from introducing distortion into the resultant signal. Such filters generally have a sharper cut-off than a typical low-pass filter used to condition a signal. To produce the desired digital error signal, the phase comparator 210 still further includes an analog-to-digital converter 216 to convert the output of the anti-aliasing filter 214 from an analog to digital signal. For one embodiment, the analog-to-digital converter 216 is a 12-bit device, converting the output of the anti-aliasing filter 214 to one of 4,096 binary codes.

The phase comparator 210 has a gain ($K_d$). For the embodiment shown in FIG. 2, $K_d$ is generally equal to the gain of the analog phase comparator 212 (e.g., output voltage range divided by $2\pi$) times the gain of the analog-to-digital converter 216 (e.g., range of output codes divided by the input voltage range). The gain of the anti-aliasing filter 214 is approximately unity.

Figure 3:
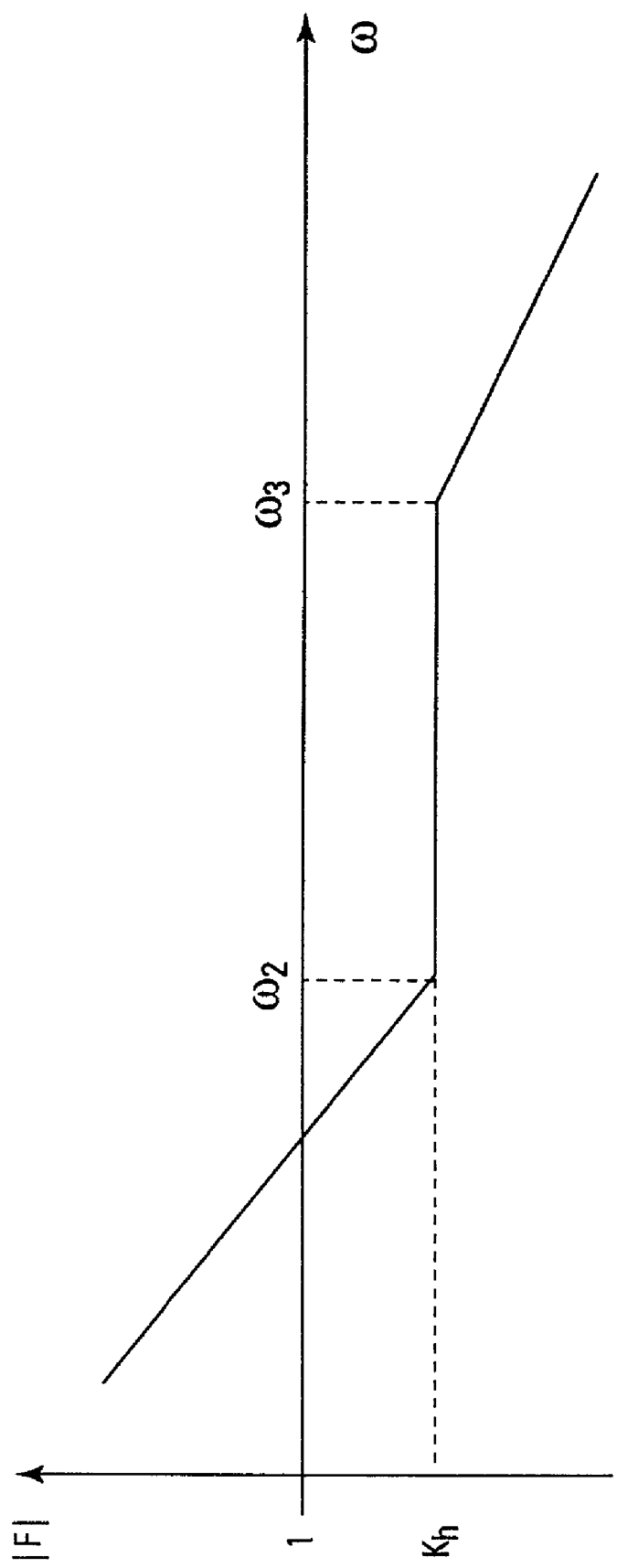
FIG. 3 is a graph of a frequency response of a typical active loop filter.

The error signal from the output of the phase comparator 210 is provided to the input of the loop filter 220. The loop filter 220 conditions the error signal and generates a control signal for input to the oscillator 230. For one embodiment, the loop filter 220 may be implemented as a digital filter to maintain the digital nature of the output of the phase comparator 210. The loop filter 220 preferably functions as an active filter and can be specified by three parameters: $K_h$, the high-frequency gain parameter; $\omega_2$, the location of the zero that sends the dc gain F(0) to infinity; and $\omega_3$, the location of the pole. FIG. 3 is a graph showing the frequency response of a typical active loop filter and the relationship of the foregoing three parameters.

The location of $\omega_2$ generally controls the percentage of overshoot in the step response of the loop filter 220. Thus, it is generally preferred to keep $\omega_2$ as small as possible. For one embodiment, $\omega_2$ is chosen to provide an overdamped system, generally designated to be the case where $\omega_2<0.25K$ with an expected overshoot of less than approximately 13%. For another embodiment, $\omega_2$ is chosen to be less than or equal to K/8 with an expected overshoot of less than approximately 10%. While reducing $\omega_2$ will result in reductions in overshoot, it will also detrimentally affect how fast the PLL 200 responds to and corrects a phase error. Accordingly, $\omega_2$ should generally not be set lower than necessary to provide a desired maximum overshoot in a response to a unit phase step.

The location of $\omega_3$ is used to attenuate higher frequency noise, e.g., at the beginning of the jitter region. If $\omega_3$ is set too close to the closed-loop bandwidth K, the PLL 200 may become unstable. For stability, the smallest practical value for $\omega_3$ is generally considered to be 4K. Thus, for one embodiment, $\omega_3$ is chosen to be greater than or equal to 4K.

The remaining loop filter parameter $K_h$ is chosen to produce a desired closed-loop bandwidth K of the PLL 200. If $\omega_2 \ll K$, then the closed-loop bandwidth K is equal to $(K_d \times K_o)/(N \times K_h)$. For one embodiment, $K_d$ is equal to approximately 587 bits/rad, where the gain of the analog phase comparator 212 is approximately $4.5V/2\pi$ or $7.1620 \times 10^{-1}$ V/rad, and the analog-to-digital converter 216 is a 12-bit device requiring a 5V range to advance from a zero output to a full-scale output, thus having a gain of 4,096 bits/5V or 819.2 bits/V; and $K_o$ is equal to approximately $2.3283 \times 10^{-3}$ Hz/bit or approximately $1.4629 \times 10^{-2}$ rad/bit, where the frequency synthesizer 234 is a 32-bit DDS device having an input frequency of 10 MHz. The selected division factor, N, of the loop frequency divider 240 is chosen to ensure that the phase comparator 210 remains linear while the input phase changes with respect to the phase of the output of the oscillator 230. For a system having a closed-loop bandwidth of approximately 0.1 Hz and a reference clock signal of 3.24 MHz, lab data suggests that this phase difference can be as large as approximately 2,027 nS.

Table 1 summarizes the maximum linear range and resolution of the phase comparator 210 having an output range of 4.5V, and using a 3.24 MHz reference clock signal, a 12-bit analog-to-digital converter 216 having an input range of 5V, and a variety of division factors for the frequency dividers 205 and 240. The maximum linear range per $2\pi$ rad is the inverse of the input frequency, i.e., the frequency-divided reference clock signal. The V/nS represents the gain of the analog phase comparator 212 divided by the maximum linear range. The resolution is the gain of the analog-to-digital converter 216 times the V/nS. Note that the results summarized in Table 1 are highly specific to the example embodiment. However, the general discussion provided above can be used to determine the maximum linear range and resolution of other systems.

TABLE 1

Phase Comparator Linear Range and Resolution

| Division Factor N | Resulting Frequency | Max Linear Range (nS/$2\pi$ rad) | V/nS | Resolution bits/nS |
|---|---|---|---|---|
| 2 | 1.62 MHz | 617 | $7.3 \times 10^{-3}$ | 6.0 |
| 4 | 0.81 MHz | 1,234 | $3.6 \times 10^{-3}$ | 3.0 |
| 8 | 405 kHz | 2,469 | $1.8 \times 10^{-3}$ | 1.5 |
| 16 | 202 kHz | 4,938 | $9.1 \times 10^{-4}$ | 0.75 |
| 32 | 101 kHz | 9,877 | $4.6 \times 10^{-4}$ | 0.37 |

Given the desire, in one embodiment, to remain linear for phase differences as large as 2,027 nS, it can be seen from Table 1 that the selected division factor for the frequency dividers 205 and 240 should be at least 8, i.e., the first division factor providing a linear range of greater than 2,027 nS. For another embodiment, the selected division factor is chosen to be approximately twice the minimum factor in order to provide improved phase range and adequate resolution. However, the value of the division factor N should not be made larger than necessary as it can begin to create spurious modulation noise concerns. Note that although the various embodiments have used the same division factor for both frequency dividers 205 and 240, thereby generating a timing signal having substantially the same frequency as the reference clock signal, different division factors could be used for each frequency divider if it is desired to produce a timing signal that is some multiple of the reference clock signal, as is known in the art.

The parameter $K_h$ of the loop filter 220 can now be calculated from the relationship $K=(K_d \times K_o)/(N \times K_h)=6.283 \times 10^{-2}$ rad/S (corresponding to a desired bandwidth of 0.01 Hz). Thus, $K_h=N \times (6.283 \times 10^{-2})/(K_d \times K_o)$. Table 2 summarizes values for the parameter $K_h$ using the phase comparator gain and oscillator gain provided in the examples above, i.e., $K_d=587$ bits/rad and $K_o=1.4629 \times 10^{-2}$ rad/bit. As before, the results summarized in Table 2 are highly specific to the example embodiment. However, the general discussion provided above can be used to determine the maximum linear range and resolution of other systems.

TABLE 2

Settings for $K_h$ to Provide 0.01 Hz Bandwidth

| Division Factor N | $K_d \times K_o/N$ | $K_h$ (rad/S) |
|---|---|---|
| 2 | 4.29 | 0.015 |
| 4 | 2.15 | 0.029 |
| 8 | 1.07 | 0.059 |
| 16 | 0.54 | 0.117 |
| 32 | 0.27 | 0.234 |

As further shown in FIG. 2, a processor 250 may be coupled to, and be a component of, the PLL 200. The processor 250 monitors signal inputs and outputs of the various components of the PLL 200 in response to instructions stored on a machine-readable medium 255. The processor 250 further provides control of various components of the PLL 200 in response to instructions stored on the machine-readable medium 255. The processor 250 is coupled to receive a Synchronization Status Message (SSM) or other status message indicative of a quality level of the reference clock signal.

As is known in the art, many of the components of a PLL may be implemented, in part or in whole, using software blocks. The software blocks include one or more instructions that may be executed by a processor, thus causing the processor to perform some task. Specific examples include frequency dividers, filters and analog-to-digital converters. The software blocks may be stored on the machine-readable medium 255. Machine-readable medium 255 may include fixed mediums, such as Read Only Memory (ROM), flash memory, fixed magnetic disks, dip switches, etc. Machine-readable medium 255 may further include removable mediums, such as magnetic diskettes, magnetic tapes, barcodes or other scannable indicia, optical disks, etc. Use of a removable machine-readable medium 255 in conjunction with the processor 250 may involve transfer of the instructions to an intermediate storage medium (not shown), such as Random Access Memory (RAM) or some other fixed medium, for use by the processor 250.

For one embodiment, the frequency dividers 205 and 240 are variable and programmable, allowing the processor 250 to receive instructions from the machine-readable medium 255 to select the division factor N.

As noted previously, crystal oscillators are prone to long-term drift despite their high accuracy. Such drift is generally due to aging of the crystal. As the frequency of the OCXO fixed frequency source 232 drifts, the nominal control signal for the DDS frequency synthesizer 234 necessary to produce the target frequency of the timing signal will drift as well. For one embodiment, a low-pass filter 225 is included to receive the output of the loop filter 220. The low-pass filter 225 filters and conditions the output signal of the loop filter 220, producing a signal that is indicative of an average value of the control signal to the frequency synthesizer 234.

For a further embodiment, the processor 250 can store the sampled output signal of the low-pass filter 225 for use as the holdover control signal of the frequency synthesizer 234 in the event of loss of the reference clock signal. Because the holdover control signal is generated from the output of the low-pass filter 225, it is buffered from extreme shifts in the output of the loop filter 220 that may immediately precede the loss of the reference clock signal. Thus, this holdover control signal will produce a more accurate timing signal than would be produced absent such buffering. For one embodiment, the holdover control signal represents the most recent filtered control signal data value prior to loss of the reference clock signal. For another embodiment, the holdover control signal represents a filtered control signal data value at a selected time delta prior to loss of the reference clock signal. Such an embodiment may be useful if the most recent filtered control signal data value is detected to contain, or anticipated to contain, noise encountered during or immediately preceding loss of the reference clock signal.

The low-pass filter 225 should generally be capable of holding its data value and ignoring further data input during holdover conditions. Because the holdover condition is entered during periods of questionable accuracy of the reference clock signal, any output generated by the loop filter 220 during this period is also questionable. The low-pass filter 225 should thus ignore the output of the loop filter 220 to avoid generating erroneous data values during the holdover condition. Thus, for one embodiment, the low-pass filter 225 is a digital filter. In response to the processor 250, the digital filter discontinues sampling the output of the loop filter 220 to hold its data value. For a further embodiment, the processor 250 resets the output of the digital filter to the value of the holdover control signal when the holdover control signal represents a filtered control signal data value at a selected time delta prior to loss of the reference clock signal.

Industry standards may require extreme accuracy requirements for holdover conditions, e.g., operation after loss of the reference clock signal. As an example, the communications system may be required to maintain a timing signal within 1 ppb of the target frequency going into a holdover condition and may be allowed only a 1 ppb drift during the next 24 hours. While the foregoing use of the holdover control signal may accomplish such industry-standard requirements, various embodiments provide further improvements for maintaining the desired timing signal frequency during holdover.

For one embodiment, the processor 250 samples the output of the low-pass filter 225 and stores data indicative of a slope of the output signal. For this embodiment, the most recent value of the output signal of the low-pass filter 225 may again be used as the initial holdover control signal as the control signal for the frequency synthesizer 234. As the slope of the output signal of the low-pass filter 225 is indicative of the demonstrated rate of drift of the fixed frequency source 232, the processor 250 can further use the slope data to periodically adjust the holdover control signal for expected drift of the fixed frequency source 232 during the holdover condition in response to the time of the adjustment period. By anticipating expected drift of the fixed frequency source 232, the accuracy of the resulting timing signal is improved. As an example, for a fixed frequency source 232 drifting slower and resulting in an output signal of the loop filter 220 increasing at a rate having a slope m, the processor 250 can periodically increase the holdover control signal at the rate of slope m. As an example, if the control signal as output from the loop filter 220 is increasing on average by one unit per day, and the adjustment period is one day, the holdover control signal should be increased by one unit for each day in the holdover condition.

A PLL 200 may also experience changes in ambient temperature during a holdover condition. While industry standards may permit additional drift if a change in the ambient temperature exceeds a certain limit, various embodiments can provide compensation for such changes in ambient temperature. For one embodiment, the PLL 200 further includes a temperature sensor 260 for providing an output signal indicative of the ambient temperature. The temperature sensor 260 should be located in close proximity to the frequency source 232.

The processor 250 samples the output of the low-pass filter 225 and the output of the temperature sensor 260. The processor 250 further stores data indicative of a relationship of the slope of the output signal of the low-pass filter 225 versus the ambient temperature. As before, the most recent value of the output of the low-pass filter 225 may be used as the initial holdover control signal. The processor 250 can then use the slope/temperature data to periodically adjust the holdover control signal for expected drift of the fixed frequency source 232 during the holdover condition in response to the time of the adjustment period and the sensed temperature during the adjustment period.

By anticipating expected drift of the fixed frequency source 232 using the expected temperature-induced variation, the accuracy of the resulting timing signal is improved. As an example, for a fixed frequency source 232 drifting slower and resulting in an output signal of the loop filter 220 increasing at a rate having a slope m at sensed temperature $T_1$ and having a slope n at sensed temperature $T_2$, the processor 250 can periodically increase the holdover control signal at the rate of slope m when the sensed temperature is at $T_1$ and at the rate of slope n when the sensed temperature is at $T_2$. For one embodiment, the sensed temperature used for determining the appropriate slope is an average sensed temperature over the adjustment period.

For another embodiment, the processor 250 extrapolates the slope/temperature data for sensed temperatures during a holdover condition that are outside the range of temperatures sensed during data capture. For a further embodiment, the processor 250 interpolates the slope/temperature data for sensed temperatures during a holdover condition that are within the range of temperatures sensed during data capture. Alternatively, the processor 250 can store variables for an equation representing the slope of the control signal as a function of ambient temperature, such as a least-squares fit of the slope/temperature data. Such an equation can then be used to periodically adjust the holdover control signal in response to the time of the adjustment period and the sensed temperature during the adjustment period.

It is noted for the various embodiments compensating for expected drift of the fixed frequency source 232 during a holdover condition that the demonstrated drift of the fixed frequency source 232 may change over time. Thus, for one embodiment, the data indicative of the slope or slope as a function of temperature is periodically refreshed. This periodic refresh may include storage of the slope data or slope/temperature data in a stack arrangement, periodically replacing old data with current data.

By permitting compensation for drift of the fixed frequency source 232 during holdover conditions, the expected drift of the timing signal is correspondingly reduced. PLLs in accordance with the foregoing description are thus especially suited for use with the invention as the expected quality level of the timing signal during holdover may approach or exceed the quality levels associated with Stratum 2 clocks or higher reference sources.

The various embodiments of the invention are adapted for use with reference sources providing an SSM or other status message indicative of a quality level of the reference clock signal. Table 3 shows the contents of some defined SSMs conforming to Synchronous Optical Network (SONET)/Synchronous Digital Hierarchy (SDH) standards. While Table 3 represents a widely-accepted standard for such SSMs, the invention is not limited to a specific standard. Furthermore, other defined and undefined quality levels for use with the SONET/SDH standards may be provided in addition to those detailed in Table 3.

TABLE 3

Synchronous Status Messages

| Quality | Abbr | Quality Level | DS1 ESF Data Link | S1 Byte |
|---|---|---|---|---|
| Stratum 1 Traceable | PRS | 1 | 0000010011111111 | 0001 |
| Synchronization-Traceable Unknown | STU | 2 | 0000100011111111 | 0000 |
| Stratum 2 Traceable | ST2 | 3 | 0000110011111111 | 0111 |
| Stratum 3 Traceable | ST3 | 4 | 0001000011111111 | 1010 |
| ±20 ppm Clock Traceable | SIC | 5 | 0010001011111111 | 1100 |
| Stratum 4 Traceable | ST4 | 6 | 0010100011111111 | Undef |
| Don't Use for Synchronization | DUS | 7 | 0011000011111111 | 1111 |

The use of holdover is well known in the use of PLLs for communications networks. The decision to enter holdover is generally based on the loss or degradation of the reference clock signal, such as might be detected from monitoring a frequency offset and comparing this frequency offset to some expected value dependent on the quality level of the reference clock signal. The various embodiments of the invention further provide for entering holdover in the event that the quality level of the reference clock is indicated to be below some predetermined target quality level, even if the reference clock is available and within its allowable drift.

Higher quality levels are generally indicative of lower levels of allowable frequency offset. For one embodiment, the target quality level is Stratum 2 or its equivalent. For another embodiment, the target quality level is Stratum 1 or its equivalent. For further embodiments, a traceable reference clock having a given level of allowable frequency offset has a higher quality level than an untraceable reference clock having the same level of allowable frequency offset.

Figure 4:
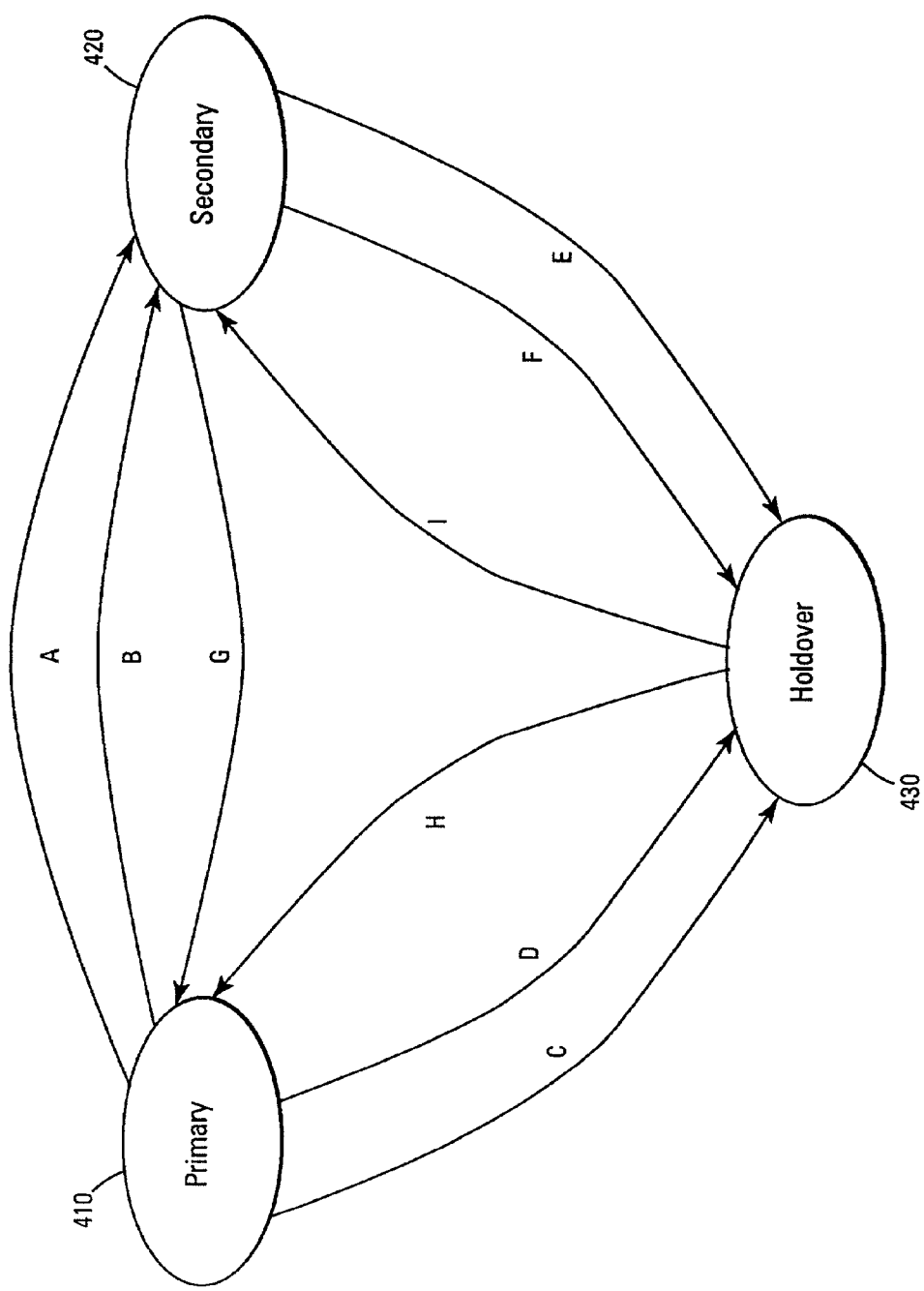
FIG. 4 is a state diagram of state transitions for a phase locked loop in accordance with an embodiment of the invention.

FIG. 4 is a state diagram of state transitions for a PLL in accordance with an embodiment of the invention. FIG. 4 illustrates three states, Primary State 410, Secondary State 420, and Holdover State 430. Additional states may be utilized without departing from the scope of the invention.

Primary State 410 symbolizes normal operation of the PLL using a primary reference clock signal as described with reference to FIG. 2. Secondary State 420 is optional and symbolizes normal operation of the PLL using a secondary reference clock signal as a redundant or backup reference clock signal. Note that more than one secondary reference clock signal may be available to the PLL. Holdover State 430 symbolizes operation of the PLL in a holdover condition, such as generation of a timing signal using a holdover control signal as described with reference to FIG. 2. Table 4 lists the state transitions depicted in FIG. 4.

TABLE 4

State Transitions

| State Transition | Definition |
|---|---|
| A | Primary reference source failure; and Secondary reference source valid and quality level of secondary reference source at or above target level |
| B | Primary and secondary reference sources valid; Quality level of secondary reference source at or above target level; and Quality level of primary reference source below target level |
| C | Primary reference source failure; and Secondary reference source failed or quality level of secondary reference source below target level |
| D | Primary reference source valid; Quality level of primary reference source below target level; and Secondary reference source failed or quality level of secondary reference source below target level |
| E | Secondary reference source failure; and Primary reference source still failed or quality level still below target level |
| F | Quality level of secondary reference source below target level; and Primary reference source still failed or quality level still below target level |
| G | Primary reference source recovers from failure with a quality level at or above target level; or Primary reference source remains valid and returns to a quality level at or above target level |
| H | Primary reference source recovers from failure with a quality level at or above target level; or Primary reference source remains valid and returns to a quality level at or above target level |
| I | Primary reference source still failed or quality level still below target level; and Secondary reference source recovers from failure with a quality level at or above target level; or Secondary reference source remains valid and returns to a quality level at or above target level |

With reference to FIG. 4 and Table 4, the PLL will transition from the Primary State 410 to the Secondary State 420 in the event of a failure of the primary reference source, and thus the primary reference clock signal, provided the secondary reference source, and thus the secondary reference clock signal, is valid and the indicated quality level of the secondary reference source is at or above the target level. Failure, as used herein, denotes a loss of the reference clock signal or a degradation of the reference clock signal such that its demonstrated drift is above the maximum allowed for its indicated quality level. Similarly, a reference source is valid if it is not failed. Note that determination of whether a reference source is valid or failed varies with its indicated quality level. As an example, a reference source indicating in its SSM that it is a Stratum 1 reference source is determined to be failed if it has a fractional frequency offset of $5\times10^{-11}$ while a reference source indicating in its SSM that it is a Stratum 2 traceable reference source is determined to be valid if it has the same fractional frequency offset.

The PLL will also transition from the Primary State 410 to the Secondary State 420 if the primary reference source is valid, but is indicating a quality level below the target level provided the secondary reference source is valid and the indicated quality level of the secondary reference source is at or above the target level. The PLL will transition directly from the Primary State 410 to the Holdover State 430, in the event the secondary reference source is failed or indicating a quality level below the target level, if either the primary reference source fails or the primary reference source indicates a quality level below the target level.

Once in the Secondary State 420, the PLL will revert to the Primary State 410, if it entered the Secondary State 420 as a result of failure of the primary reference source, when the primary reference source recovers from its failure with an indicated quality level at or above the target level. The PLL will revert to the Primary State 410, if it entered the Secondary State 420 as a result of indicating a quality level of the primary reference source below the target level, when the primary reference source remains valid and again indicates a quality level at or above the target level. The PLL will transition from the Secondary State 420 to the Holdover State 430 if the secondary reference source fails or indicates a quality level below the target level, provided the primary reference source is still failed or still indicating a quality level below the target level.

Once in the Holdover State 430, the PLL will transition to the Primary State 410, if it entered the Holdover State 430 as a result of failure of the primary reference source, when the primary reference source recovers from its failure with an indicated quality level at or above the target level. The PLL will transition to the Primary State 410, if it entered the Holdover State 430 as a result of indicating a quality level of the primary reference source below the target level, when the primary reference source remains valid and again indicates a quality level at or above the target level. The PLL will transition from the Holdover State 430 to the Secondary State 420 if the secondary reference source is valid and indicates a quality level at or above the target level, but the primary reference source is either failed or indicating a quality level below the target level.

A state machine, such as that depicted in FIG. 4, may be carried out by a processor. As an example, the state machine of FIG. 4 may be applied to PLL 200 by processor 250 coupled to receive a status message. Instructions for causing a processor to carry out the state machine are generally stored on a machine-readable medium, such as machine-readable medium 255. The processor 250 monitors the status message and reference clock signals of the available reference sources and carries out the state machine in response to the status message and reference clock signals.

Note that while transitions to the Holdover State 430 generally occur immediately upon satisfying the conditions for entering the holdover condition, transitions out of the Holdover State 430 may be delayed by some period to raise the confidence level that the reference clock signal will remain valid and/or at an acceptable quality level. As such, the reference source may not be deemed valid until some first predetermined period after it has met the timing requirements for its indicated quality level. Likewise, the reference source may be deemed to be at a higher quality level only after it has been at the higher quality level from some second predetermined period. The first and second predetermined periods need not be of the same duration. As an example, recovery from a failed status may be deemed to occur 20 seconds after the reference source meets timing requirements for its indicated quality level while transitions to a higher quality level may be deemed to occur substantially instantaneously.

Figure 5:
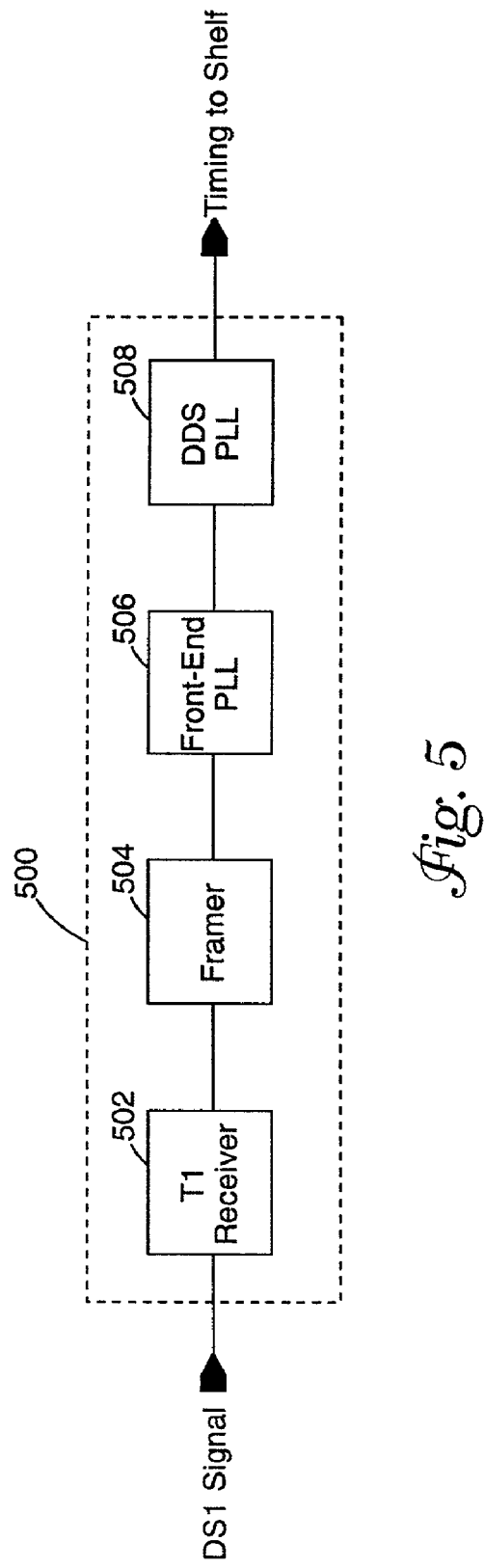
FIG. 5 is a block diagram of a timing circuit in accordance with an embodiment of the invention.

Phase locked loops of the type described above may find use in communications networks such as synchronous communications networks. As an example, PLLs in accordance with the various embodiments of the invention may form a portion of a timing circuit of a shelf controller. FIG. 5 is a block diagram of a timing circuit 500 including a T1 receiver 502 for receiving a communication signal, such as a DS1 signal, and recovering clock and data signals therefrom; a framer 504 for locating a frame pulse and generating the external reference clock signal from the recovered clock and data signals; a first or front-end PLL 506 as an optional pre-scaler for pre-scaling the reference clock signal; and a second PLL 508 in accordance with the various embodiments of the invention for generating a synchronization timing signal derived from the reference clock signal. The synchronization timing signal is provided to a shelf backplane of a communications network element for synchronization of various shelf elements within the network element. The first PLL 506 is used in this embodiment for pre-scaling the reference clock signal to the second PLL 508 to reduce noise effects on the synchronization timing signal. However, the second PLL 508 could be used to produce the synchronization timing signal directly, without the use of the pre-scaler.

Figure 6:
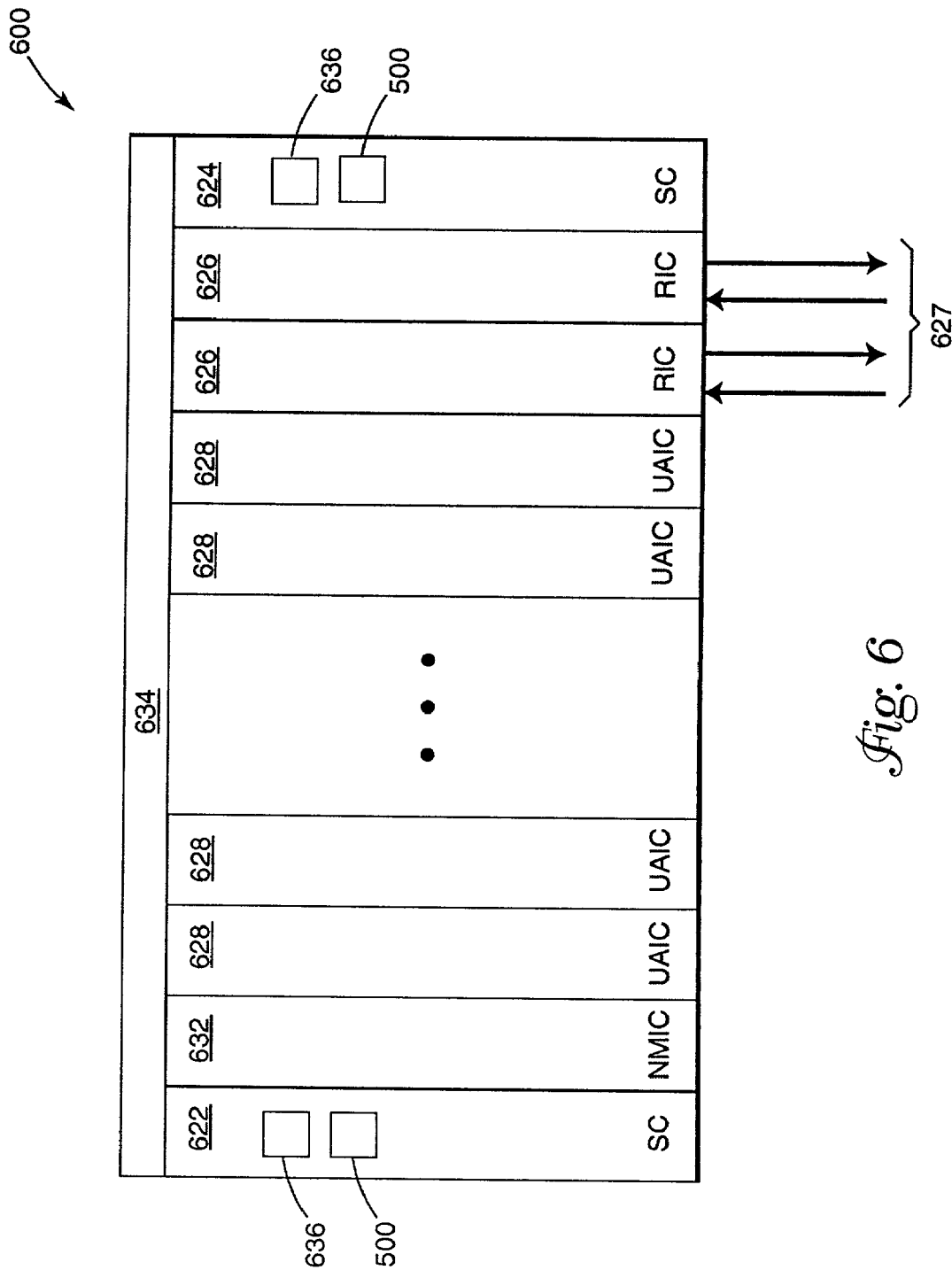
FIG. 6 is a block diagram of a network element in accordance with an embodiment of the invention.

FIG. 6 is a block diagram of a network element 600 in accordance with one embodiment of the invention containing first shelf controller 622 and second shelf controller 624 for redundant control of various shelf elements. The first, or primary, shelf controller 622 receives a primary building integrated timing supply (BITS) signal and a secondary BITS signal. The second, or redundant, shelf controller 624 also receives the primary BITS signal and the secondary BITS signal.

The shelf controllers 622/624 each contain a timing circuit 500 and a processor 636 coupled to its associated timing circuit 500. At least one of the timing circuits 500 contains a PLL in accordance with the foregoing embodiments for generating a timing signal from a reference clock signal, wherein the reference clock signal is obtained from any of the primary BITS signal, the secondary BITS signal, or another secondary reference clock signal from one of the remaining shelf elements.

The shelf elements may include ring interface cards 626 for redundant communications with other network elements through lines 627, and user access interface cards 628 for various user-interface functions to the network element 600 from a local area network (LAN). The shelf elements may further include other cards supporting such functions as network management, e.g., network management interface card (NMIC) 632.

For one embodiment, the network element 600 contains 18 shelf elements including the two shelf controllers 622/624. Each shelf element is coupled to the shelf backplane 634 for distribution of the second timing signal and for communication among the various shelf elements, e.g., communication between a user access interface card 628 and a ring interface card 626 for carrying out communication to or from other network elements 600.

Figure 7:
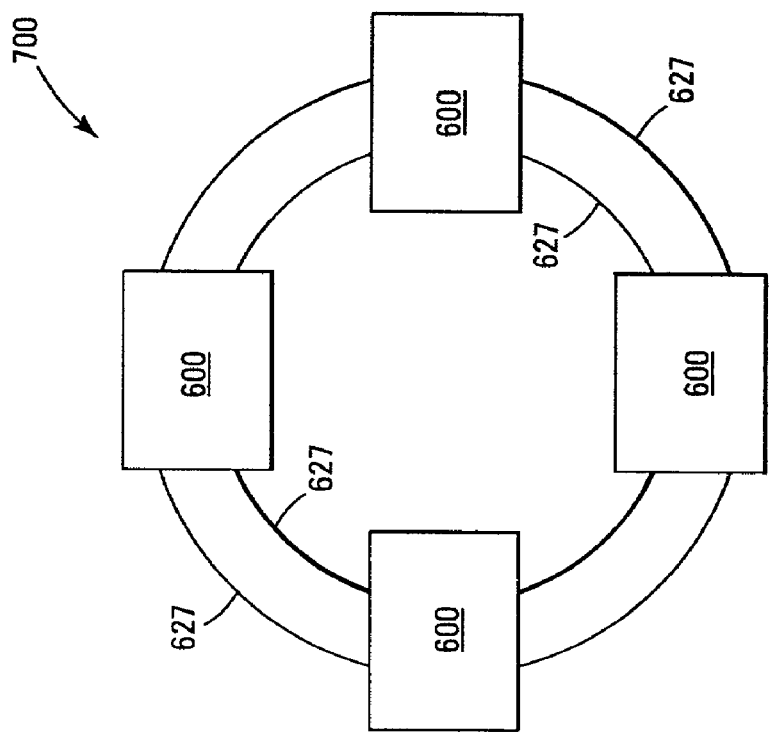
FIG. 7 is a block diagram of a network having a ring configuration in accordance with an embodiment of the invention.

FIG. 7 is a block diagram of a network 700 containing two or more network elements 600 in a ring configuration and having redundant I/O for each network element 600. At least one network element 600 of network 700 contains a PLL in accordance with the various embodiments of the invention.

Figure 8:
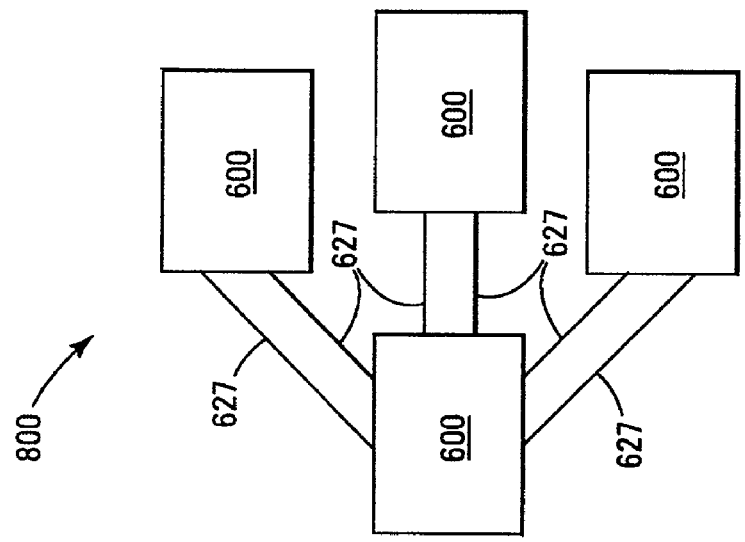
FIG. 8 is a block diagram of a network having a star configuration in accordance with an embodiment of the invention.

FIG. 8 is a block diagram of a network 800 containing two or more network elements 600 in a star configuration. At least one network element 600 of network 800 contains a PLL in accordance with the various embodiments of the invention.

CONCLUSION

Phase locked loops (PLL) providing for conditional holdover are especially suited for use in communications networks. During a holdover condition, the timing signal is generated without use of an input reference clock signal. The PLLs may either enter or remain in a holdover condition if the demonstrated or expected quality level of the output of the PLL equals or exceeds the indicated quality level of the input reference clock signal. In this manner, the timing signal has an expected quality level equal to or greater than the quality level of the reference clock signal. Accordingly, network timing errors may be reduced to levels below those associated with using the reference clock signal.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any such adaptations or variations of the invention. It is manifestly intended that this invention be limited only by the following claims and equivalents thereof.

What is claimed is:

1. A phase locked loop, comprising:
a phase comparator having a first input for receiving a reference clock signal, a second input for receiving a feedback signal, and an output for providing an error signal;
a loop filter having an input for receiving the error signal and an output for providing a control signal;
an oscillator having an input for receiving the control signal and an output for providing a timing signal, wherein the feedback signal is derived from the timing signal;
a processor coupled to the oscillator, wherein the processor is further coupled to receive a status message from a source of the reference clock signal indicative of a quality level of the reference clock signal; and
a machine-readable medium coupled to the processor, wherein the machine-readable medium has instructions stored thereon capable of causing the processor to monitor the status message and to selectively place the phase locked loop in a holdover condition in response to the status message;
wherein the instructions stored on the machine-readable medium are capable of causing the processor to place the phase locked loop in the holdover condition when a quality level of the reference clock signal indicated by the status message is less than an expected quality level of the phase locked loop in the holdover condition.

2. The phase locked loop of claim 1, wherein the instructions stored on the machine-readable medium are capable of causing the processor to selectively place the phase locked loop in the holdover condition in response to the status message regardless of a validity of the reference clock signal.

3. A phase locked loop, comprising:
a phase comparator having a first input for receiving a reference clock signal, a second input for receiving a feedback signal, and an output for providing an error signal, wherein the reference clock signal is selected from a group consisting of a primary reference clock signal and at least one secondary reference clock signal;
a loop filter having an input for receiving the error signal and an output for providing a control signal;
an oscillator having an input for receiving the control signal and an output for providing a timing signal, wherein the feedback signal is derived from the timing signal;
a processor coupled to the oscillator, wherein the processor is further coupled to receive status messages from respective sources of the primary reference clock signal and the at least one secondary reference clock signal indicative of a quality level of the primary reference clock signal and the at least one secondary reference clock signal; and
a machine-readable medium coupled to the processor, wherein the machine-readable medium has instructions stored thereon capable of causing the processor to monitor the status messages and to selectively place the phase locked loop in a holdover condition in response to the status messages;
wherein the instructions stored on the machine-readable medium are capable of causing the processor to place the phase locked loop in the holdover condition when a quality level of the primary reference clock signal and the at least one secondary reference clock signal indicated by the status message is less than an expected quality level of the phase locked loop in the holdover condition.

4. A phase locked loop, comprising:
a phase comparator having a first input for receiving a reference clock signal, a second input for receiving a feedback signal, and an output for providing an error signal;
a loop filter having an input for receiving the error signal and an output for providing a control signal;
an oscillator having an input for receiving the control signal and an output for providing a timing signal, wherein the feedback signal is derived from the timing signal;
a processor coupled to the oscillator, wherein the processor is further coupled to receive a status message from a source of the reference clock signal indicative of a quality level of the reference clock signal; and
a machine-readable medium coupled to the processor, wherein the machine-readable medium has instructions stored thereon capable of causing the processor to monitor the status message and to place the phase locked loop in a holdover condition if the quality level indicated by the status message is below a target quality level;
wherein the target quality level is an expected quality level of the phase locked loop in the holdover condition.

5. The phase locked loop of claim 4, wherein the expected quality level is at least a Stratum 2 level.

6. The phase locked loop of claim 4, wherein the instructions stored on the machine-readable medium are capable of causing the processor to monitor the status message and to place the phase locked loop in the holdover condition if the quality level indicated by the status message is below the target quality level when the reference clock signal is valid.

7. A phase locked loop, comprising:
a phase comparator having a first input for receiving a reference clock signal, a second input for receiving a feedback signal, and an output for providing an error signal, wherein the reference clock signal is selected from a group consisting of a primary reference clock signal and at least one secondary reference clock signal;

a loop filter having an input for receiving the error signal and an output for providing a control signal;

an oscillator having an input for receiving the control signal and an output for providing a timing signal, wherein the feedback signal is derived from the timing signal;

a processor coupled to the oscillator, wherein the processor is further coupled to receive status messages from respective sources of the primary reference clock signal and the at least one second clock signal indicative of a quality level of the primary reference clock signal and the at least one secondary reference clock signal; and a machine-readable medium coupled to the processor, wherein the machine-readable medium has instructions stored thereon capable of causing the processor to monitor the status messages and to place the phase locked loop in a holdover condition if the quality level indicated by each status message is below a target quality level regardless of a validity of any reference clock signal;

wherein the target quality level is an expected quality level of the phase locked loop in the holdover condition.

8. A timing circuit, comprising:

a receiver coupled to receive a communications signal and for recovering clock and data signals and a status message therefrom;

a framer for locating a frame pulse and generating a reference clock signal from the recovered clock and data signals; and a phase locked loop coupled to receive the reference clock signal and to generate a timing signal therefrom, the phase locked loop comprising:

a phase comparator having a first input for receiving a reference clock signal, a second input for receiving a feedback signal, and an output for providing an error signal;

a loop filter having an input for receiving the error signal and an output for providing a control signal;

an oscillator having an input for receiving the control signal and an output for providing a timing signal, wherein the feedback signal is derived from the timing signal;

a processor coupled to the oscillator, wherein the processor is further coupled to receive the status message, wherein the status message is indicative of a quality level of the reference clock signal; and a machine-readable medium coupled to the processor, wherein the machine-readable medium has instructions stored thereon capable of causing the processor to monitor the status message and to selectively place the phase locked loop in a holdover condition in response to the status message; and a pre-scaler interposed between the framer and the phase locked loop.

9. A timing circuit, comprising:

a receiver coupled to receive a communications signal and for recovering clock and data signals and a status message therefrom;

a framer for locating a frame pulse and generating a reference clock signal from the recovered clock and data signals; and a phase locked loop coupled to receive the reference clock signal and to generate a timing signal therefrom, the phase locked loop comprising:

a phase comparator having a first input for receiving a reference clock signal, a second input for receiving a feedback signal, and an output for providing an error signal;

a loop filter having an input for receiving the error signal and an output for providing a control signal;

an oscillator having an input for receiving the control signal and an output for providing a timing signal, wherein the feedback signal is derived from the timing signal;

a processor coupled to the oscillator, wherein the processor is further coupled to receive the status message, wherein the status message is indicative of a quality level of the reference clock signal; and a machine-readable medium coupled to the processor, wherein the machine-readable medium has instructions stored thereon capable of causing the processor to monitor the status message and to place the phase locked loop in a holdover condition if the quality level indicated by the status message is below a target quality level; and a pre-scaler interposed between the framer and the phase locked loop.

10. The timing circuit of claim 9, wherein the instructions stored on the machine-readable medium are capable of causing the processor to monitor the status message and to place the phase locked loop in the holdover condition if the quality level indicated by the status message is below the target quality level when the reference clock signal is valid.

11. A shelf controller for controlling synchronization of shelf elements in a communications network element, the shelf controller comprising:

a processor;

a machine-readable medium coupled to the processor; and a timing circuit coupled to the processor and providing a timing signal for controlling synchronization of the shelf elements in the communications network element, wherein the timing circuit comprises:

a receiver coupled to receive a communications signal and for recovering clock and data signals and a status message therefrom;

a framer for locating a frame pulse and generating a reference clock signal from the recovered clock and data signals, wherein the status message is indicative of a quality level of the reference clock signal; and a phase locked loop coupled to receive the reference clock signal and to generate a timing signal therefrom, the phase locked loop comprising:

a phase comparator having a first input for receiving a reference clock signal, a second input for receiving a feedback signal, and an output for providing an error signal;

a loop filter having an input for receiving the error signal and an output for providing a control signal; and an oscillator coupled to the processor and having an input for receiving the control signal and an output for providing a timing signal, wherein the feedback signal is derived from the timing signal;

wherein the machine-readable medium has instructions stored thereon capable of causing the processor to monitor the status message and to selectively place the phase locked loop in a holdover condition in response to the status message; and wherein the instructions stored on the machine-readable medium are capable of causing the processor to place the phase locked loop in the holdover condition when a quality level of the reference clock signal indicated by the status message is less than an expected quality level of the phase locked loop in the holdover condition.

12. A network element for a communications network, the network element comprising:
a shelf backplane; and
a plurality of shelf elements coupled to the shelf backplane, wherein the plurality of shelf elements includes at least one shelf controller for controlling synchronization of the plurality of shelf elements, the at least one shelf controller comprising:
a processor;
a machine-readable medium coupled to the processor; and
a timing circuit coupled to the processor and providing a timing signal for controlling synchronization of the shelf elements in the communications network element, wherein the timing circuit comprises:
a receiver coupled to receive a communications signal and for recovering clock and data signals and a status message therefrom;
a framer for locating a frame pulse and generating a reference clock signal from the recovered clock and data signals, wherein the status message is indicative of a quality level of the reference clock signal; and
a phase locked loop coupled to receive the reference clock signal and to generate a timing signal therefrom, the phase locked loop comprising:
a phase comparator having a first input for receiving a reference clock signal, a second input for receiving a feedback signal, and an output for providing an error signal;
a loop filter having an input for receiving the error signal and an output for providing a control signal; and
an oscillator coupled to the processor and having an input for receiving the control signal and an output for providing a timing signal, wherein the feedback signal is derived from the timing signal;
wherein the timing circuit provides a synchronization timing signal to the shelf backplane for the synchronization of the plurality of shelf elements;
wherein the synchronization timing signal is derived from the first timing signal; and
wherein the machine-readable medium has instructions stored thereon capable of causing the processor to monitor the status message and to selectively place the phase locked loop in a holdover condition in response to the status message.

13. A method of generating a timing signal, comprising:
generating the timing signal from a reference clock signal in a phase locked loop;
monitoring a status message from a source of the reference clock signal indicative of a quality level of the reference clock signal; and
placing the phase locked loop in a holdover condition if the quality level indicated by the status message is below a target level;
wherein the method is performed in the order presented;
wherein the target level is an expected quality level of the phase locked loop in the holdover condition.

14. The method of claim 13, wherein the expected quality level is a Stratum 2 level.

15. The method of claim 13, wherein placing the phase locked loop in the holdover condition if the quality level indicated by the status message is below the target level occurs when the reference clock signal is valid.

16. A method of generating a timing signal, comprising:
generating the timing signal from a reference clock signal in a phase locked loop, wherein the reference clock signal is selected from the group consisting of a primary reference clock signal and at least one secondary reference clock signal;
monitoring status messages from respective sources of the primary reference clock signal and the at least one second reference clocks signal indicative of a quality level of the primary reference clock signal and the at least one secondary reference clock signal; and
placing the phase locked loop in a holdover condition if the quality level indicated by each status message is below a target level regardless of a validity of any reference clock signal; and
wherein the method is performed in the order presented.

17. The method of claim 16, further comprising:
maintaining the phase locked loop in the holdover condition until at least one of the reference clock signals is valid and has a status message indicating a quality level at or above the target level.

18. The method of claim 17, wherein the phase locked loop is maintained in the holdover condition for a predetermined period after a reference clock signal having a valid status has a status message indicating a quality level at or above the target level.

19. A method of generating a timing signal, comprising:
during a time when a primary reference clock signal is valid and has an indicated quality level at or above a target level:
generating a first error signal indicative of a phase relationship between the primary reference clock signal and a first feedback signal;
filtering the first error signal to produce a first control signal;
generating the timing signal in response to the first control signal; and
deriving the first feedback signal from the timing signal;
during a time when the primary reference clock signal is failed or has an indicated quality level below the target level, and when a secondary reference clock signal is valid and has an indicated quality level at or above the target level:
generating a second error signal indicative of a phase relationship between the secondary reference clock signal and a second feedback signal;
filtering the second error signal to produce a second control signal;
generating the timing signal in response to the second control signal; and
deriving the second feedback signal from the timing signal; and
during a time when each reference clock signal is failed or has an indicated quality level below the target level:
generating a holdover control signal; and
generating a timing signal in response to the holdover control signal;
wherein the method is performed in the order presented; and
wherein the indicated quality level of least one of the primary reference clock signal and the secondary reference clock signal is determined based at least in part on status messages received from respective sources of the primary reference clock signal and the secondary reference clock signal.

20. A method of generating a timing signal, comprising:
during a time when a primary reference clock signal is valid and has an indicated quality level at or above a target level:
generating a first error signal indicative of a phase relationship between the primary reference clock signal and a first feedback signal;
filtering the first error signal to produce a first control signal;
generating the timing signal in response to the first control signal; and
deriving the first feedback signal from the timing signal;
during a time when the primary reference clock signal either is failed or is valid and has an indicated quality level below the target level, and when a secondary reference clock signal is valid and has an indicated quality level at or above the target level:
generating a second error signal indicative of a phase relationship between the secondary reference clock signal and a second feedback signal;
filtering the second error signal to produce a second control signal;
generating the timing signal in response to the second control signal; and
deriving the second feedback signal from the timing signal; and
during a time when each reference clock signal either is failed or is valid and has an indicated quality level below the target level:
generating a holdover control signal; and
generating a timing signal in response to the holdover control signal;
wherein the method is performed in the order presented; and
wherein the indicated quality level of least one of the primary reference clock signal and the secondary reference clock signal is determined based at least in part on status messages received from respective sources of the primary reference clock signal and the secondary reference clock signal.

21. A machine-readable medium having instructions stored thereon capable of causing a processor to perform a method of generating a timing signal, the method comprising:
generating the timing signal from a reference clock signal in a phase locked loop;
monitoring a status message received from a source of the reference clock signal indicative of a quality level of the reference clock signal; and
placing the phase locked loop in a holdover condition if the quality level indicated by the status message is below a target level;
wherein the method is performed in the order presented.

22. The machine-readable medium of claim 21, wherein placing the phase locked loop in the holdover condition if the quality level indicated by the status message is below the target level occurs when the reference clock signal is valid.

23. A machine-readable medium having instructions stored thereon capable of causing a processor to perform a method of generating a timing signal, the method comprising:
generating the timing signal from a reference clock signal in a phase locked loop, wherein the reference clock signal is selected from the group consisting of a primary reference clock signal and at least one secondary reference clock signal;
monitoring status messages received from respective sources of the primary reference clock signal and the at least one secondary reference clock signal indicative of a quality level of the primary reference clock signal and the at least one secondary reference clock signal; and
placing the phase locked loop in a holdover condition if the quality level indicated by each status message is below a target level regardless of a validity of any reference clock signal;
wherein the method is performed in the order presented.

24. A machine-readable medium having instructions stored thereon capable of causing a processor to perform a method of generating a timing signal, the method comprising:
during a time when a primary reference clock signal is valid and has an indicated quality level at or above a target level:
generating a first error signal indicative of a phase relationship between the primary reference clock signal and a first feedback signal;
filtering the first error signal to produce a first control signal;
generating the timing signal in response to the first control signal; and
deriving the first feedback signal from the timing signal;
during a time when the primary reference clock signal is failed or has an indicated quality level below the target level, and when a secondary reference clock signal is valid and has an indicated quality level at or above the target level:
generating a second error signal indicative of a phase relationship between the secondary reference clock signal and a second feedback signal;
filtering the second error signal to produce a second control signal;
generating the timing signal in response to the second control signal; and
deriving the second feedback signal from the timing signal; and
during a time when each reference clock signal is failed or has an indicated quality level below the target level:
generating a holdover control signal; and
generating a timing signal in response to the holdover control signal;
wherein the method is performed in the order presented; and
wherein the indicated quality level of least one of the primary reference clock signal and the secondary reference clock signal is determined based at least in part on status messages received from respective sources of the primary reference clock signal and the secondary reference clock signal.

25. A machine-readable medium having instructions stored thereon capable of causing a processor to perform a method of generating a timing signal, the method comprising:
during a time when a primary reference clock signal is valid and has an indicated quality level at or above a target level:
generating a first error signal indicative of a phase relationship between the primary reference clock signal and a first feedback signal;
filtering the first error signal to produce a first control signal;
generating the timing signal in response to the first control signal; and
deriving the first feedback signal from the timing signal;
during a time when the primary reference clock signal either is failed or is valid and has an indicated quality level below the target level, and when a secondary reference clock signal is valid and has an indicated quality level at or above the target level:

generating a second error signal indicative of a phase relationship between the secondary reference clock signal and a second feedback signal;

filtering the second error signal to produce a second control signal;

generating the timing signal in response to the second control signal; and deriving the second feedback signal from the timing signal; and during a time when each reference clock signal either is failed or is valid and has an indicated quality level below the target level:

generating a holdover control signal; and generating a timing signal in response to the holdover control signal;

wherein the method is performed in the order presented;

wherein the indicated quality level of least one of the primary reference clock signal and the secondary reference clock signal is determined based at least in part on status messages received from respective sources of the primary reference clock signal and the secondary reference clock signal.

* * * * *